United States Patent
Hirano (10) Patent No.: US 6,747,901 B2
(45) Date of Patent: Jun. 8, 2004

(54) NONVOLATILE SEMICONDUCTOR MEMORY DEVICE CAPABLE OF PREVENTING OCCURRENCE OF LATCH-UP

(75) Inventor: Yasuaki Hirano, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 36 days.

(21) Appl. No.: 10/052,519

(22) Filed: Jan. 23, 2002

(65) Prior Publication Data

US 2002/0159298 A1 Oct. 31, 2002

(30) Foreign Application Priority Data

Feb. 28, 2001 (JP) ........................................ 2001-054270

(51) Int. Cl.$^7$ .............................................. G11C 16/04
(52) U.S. Cl. ............................ 365/185.29; 365/185.18; 365/365.19
(58) Field of Search ....................... 365/185.29, 185.18, 365/185.19, 185.01

(56) References Cited

U.S. PATENT DOCUMENTS 5,790,460 A   8/1998  Chen et al.
6,122,196 A * 9/2000  Tanaka et al. ......... 365/185.13
6,219,281 B1 * 4/2001  Chen et al. ............ 365/185.29
6,404,681 B1 * 6/2002  Hirano .................. 365/185.33

FOREIGN PATENT DOCUMENTS

JP   11-039890   2/1999

* cited by examiner

*Primary Examiner*—Hoai Ho
(74) *Attorney, Agent, or Firm*—Morrison & Foerster LLP (57) ABSTRACT

In a memory cell array, a floating-gate field-effect transistor connected to a word line and a bit line is disposed in a matrix configuration. The floating-gate field-effect transistor is composed of a source and a drain formed inside a P-type well provided inside an N-type well on a P-type semiconductor substrate, a floating gate formed over between the source and the drain with a tunnel oxide interposed therebetween, and a control gate formed on the floating gate with an interlayer insulating film interposed therebetween. When an erasing pulse is applied, a voltage of 6V is applied to the P-type well with use of a first high-voltage pumping circuit, while a voltage of 9V is applied to the N-type well with use of a second high-voltage pumping circuit. This makes it possible to provide a highly reliable nonvolatile semiconductor memory device capable of preventing occurrence of latchup.

5 Claims, 10 Drawing Sheets

NONVOLATILE SEMICONDUCTOR MEMORY DEVICE CAPABLE OF PREVENTING OCCURRENCE OF LATCH-UP

BACKGROUND OF THE INVENTION

The present invention relates to a nonvolatile semiconductor memory device.

Figure 9:
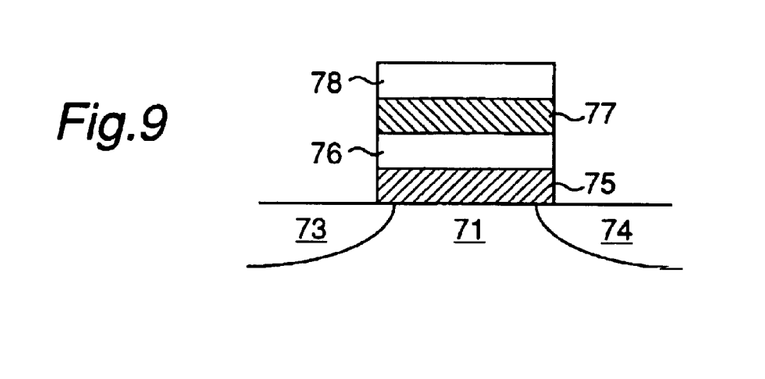
FIG. 9 is a schematic cross sectional view showing main part of a floating-gate field-effect transistor of a conventional nonvolatile semiconductor memory device.

The flash memory most commonly used today is an ETOX (Trademark of Intel Co.). A schematic cross sectional view of a floating-gate field-effect transistor of this ETOX-type flash memory cell is shown in FIG. 9. The floating-gate field-effect transistor is provided with a source 73 and a drain 74 formed on a substrate 71, a floating gate 76 formed over between the source 73 and the drain with a tunnel oxide 75 interposed therebetween, and a control gate 78 formed on the floating gate 76 with an interlayer insulating film 77 interposed therebetween.

Description will be now given of an operational principle of the ETOX-type flash memory. Table 1 below describes voltage conditions in writing, erasing, and reading operation.

TABLE 1

|  | Control gate | Drain | Source | Substrate |
|---|---|---|---|---|
| Writing | 10 V | 6 V/0 V | 0 V | 0 V |
| Erasing | −9 V | OPEN | 4 V | 0 V |
| Reading | 5 V | 1 V | 0 V | 0 V |

Figure 10:
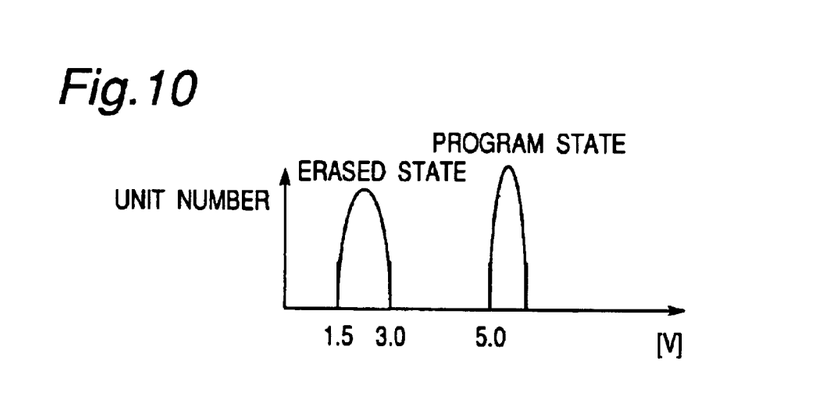
FIG. 10 is a graph showing a threshold value distribution of the floating-gate field-effect transistor.

In writing operation, as shown in Table 1, a voltage Vpp (ex., 10V) is applied to the control gate 78, a reference voltage Vss (ex., 0V) is applied to the source 73, and a voltage of 6V is applied to the drain 74. Consequently, a large current flows through a channel region between the source 73 and the drain 74, and hot electrons are generated in an area with high electric fields on the drain side, by which electrons are injected into the floating gate 76. As a result, a threshold value is increased, which activates a program state. The threshold value in the program state is shown in FIG. 10.

In erasing operation, a voltage Vnn (ex., −9V) is applied to the control gate 78, and a voltage Vpe (ex., 4V) is applied to the source 73, so that electrons are pulled toward the source side from the floating gate 76 and the threshold value is decreased, thereby activating an erased state. The threshold value in the erased state is shown in FIG. 10.

In such erasing operation, a BTBT (Band To Band Tunneling) current flows, while at the same time, hot holes and hot electrons are generated. The hot electrons flow away in a substrate direction, whereas the hot holes are pulled toward the tunnel oxide 75 side and trapped inside the tunnel oxide 75. Generally, this phenomenon is considered to be a cause of deteriorated reliability of flash memories.

In reading operation, a voltage of 1V is applied to the drain 74, a voltage of 0V is applied to the source 73, and a voltage of 5V is applied to the control gate 78. Herein, if the threshold value is in the erased state and low, current flows into a memory cell and status of the memory cell is determined to be "1". If the threshold value is in the program state and high, current does not flow into a memory cell, and status of the memory cell is determined to be "0".

As described above, this kind of operation method has a problem that a BTBT current generated in the erasing operation causes deteriorated reliability of the memory cells. One solution to this problem is a channel erasing operation which does not generate the BTBT current at the time of erasing. A nonvolatile semiconductor memory device with use of the channel erasing is disclosed in Japanese Patent Laid-Open Publication HEI No. 11-39890. In the Japanese Patent Laid-Open Publication HEI No. 11-39890, writing and reading operation is performed in the same way as the above-stated method.

Figure 11:
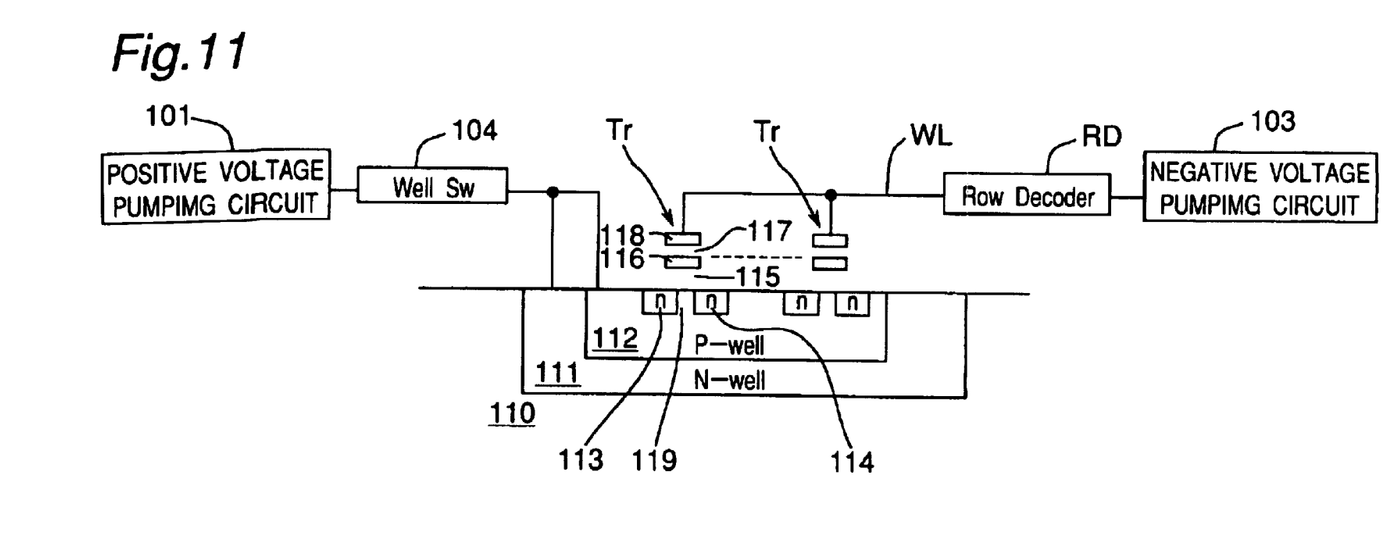
FIG. 11 is an outlined block diagram of a conventional nonvolatile semiconductor memory device.

Hereinbelow, description will be made of the channel erasing operation with reference to FIG. 11. As shown in FIG. 11, each floating-gate field-effect transistor Tr is provided with a source 113 and a drain 114 formed inside a P-type well 112 provided inside an N-type well 111 on a semiconductor substrate 110, a floating gate 116 formed over between the source 113 and the drain 114 with a tunnel oxide 115 interposed therebetween, and a control gate 118 formed on the floating gate 116 with an interlayer insulating film 117 interposed therebetween. Reference numeral 119 denotes a channel region.

In erasing operation, a voltage Vnn (ex., −9V) is applied to the control gate 118 through a word line WL, when a voltage Vesc (ex., +6V) is applied to the source 113 and the P-type well 112. Consequently, strong electric fields are applied to the tunnel oxide 115 of the floating-gate field-effect transistor Tr. As a result, an FN (Fowler-Nordheim) tunneling phenomenon occurs, which causes electrons in the floating gate 116 to be pulled out, resulting in decreased threshold value. Voltage application conditions in this case are outlined in Table 2 below.

TABLE 2

|  | Control gate | Drain | Source | P-type well | N-type well |
|---|---|---|---|---|---|
| Writing | 10 V | 6 V/0 V | 0 V | 0 V | 3 V |
| Erasing | −9 V | OPEN | 6 V (or OPEN) | 6 V | 6 V |
| Reading | 5 V | 1 V | 0 V | 0 V | 3 V |

In erasing operation, as shown in Table 2, potential of the source 113 is equal to potential of the P-type well 112, so that electric fields are not concentrated onto an interface between the source 113 and the P-type well 112, and therefore the BTBT current is not generated. As a result, hot holes are not trapped in the tunnel oxide 115, which improves reliability of the memory cells, i.e., reliability of the floating-gate field-effect transistor Tr.

Description is herein given of a voltage supply circuit for executing channel erasing. The voltage supply circuit is provided with a positive voltage pumping circuit 101 and a negative voltage pumping circuit 103. The positive voltage pumping circuit 101 is connected to an N-type well 111 on a substrate 110 and a P-type well 112 via a well switch 104. The negative voltage pumping circuit 103 is connected to a control gate 118 of the floating-gate field-effect transistor Tr via a row decoder RD. The control gate 118 and the row decoder RD are connected by a word line WL.

According to the above-structured voltage supply circuit, when erasing operation is started, the negative voltage pumping circuit 103 operates to output a negative voltage (ex., −9V) to the word line WL. Consequently, a voltage of −9V is applied to the control gate 118. At this time, the positive voltage pumping circuit 101 also operates to apply a positive voltage (ex., 6V) outputted by the positive voltage pumping circuit 101 to the N-type well 111 and the P-type well 112.

Figure 12:
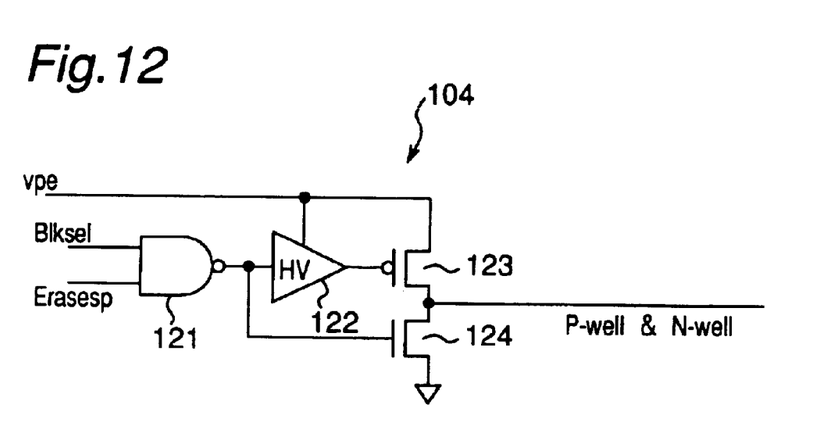
FIG. 12 is a schematic circuit diagram of a well of the conventional nonvolatile semiconductor memory device.

FIG. 12 shows a circuit diagram of the well switch 104. The well switch 104 is composed of an NAND gate 121, a voltage level shifter 122, a P-type MOS (Metal Oxide Semiconductor) FET 123, and an N-type MOSFET 124. A voltage of 6V is outputted to the N-type well 111 and the P-type well 112 when the P-type MOSFET 123 is set to ON state by an Erasesp signal.

Upon completion of pulse application, there is executed a shutdown sequence for setting the P-type well 112 and the word line WL to have a reference voltage (Vss). More particularly, an Erasesp signal becomes low, voltage of the word line WL is forced to be a reference voltage Vss, and voltage of the P-type well 112 is forced to be a reference voltage Vss.

Figure 13:
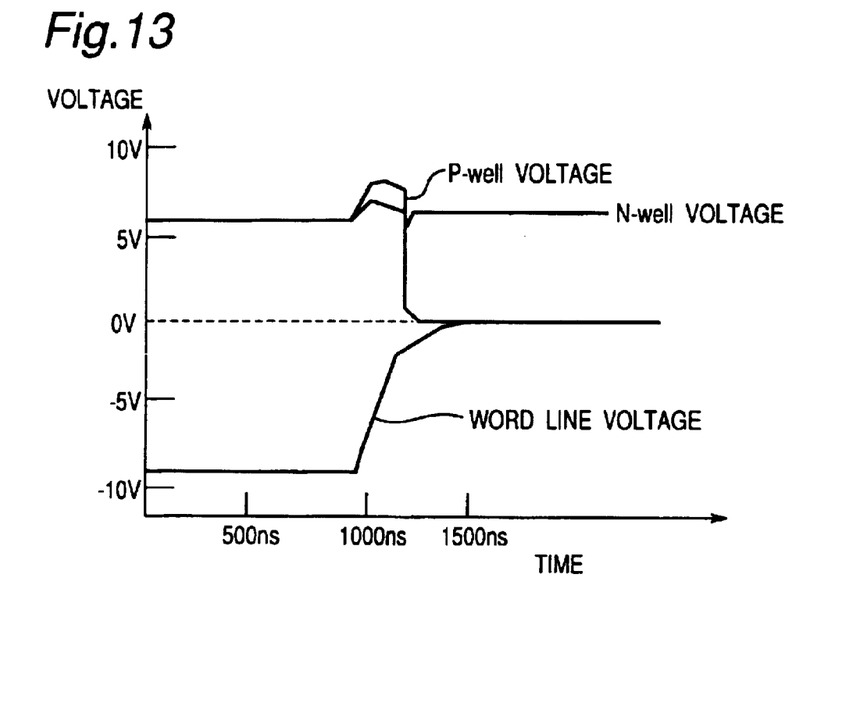
FIG. 13 is a graph showing voltage waveforms of a word line, an N-type well and a P-type well of the conventional nonvolatile semiconductor memory device.

Finally, the positive voltage pumping circuit 101 and the negative voltage pumping circuit 103 are stopped. FIG. 13 shows one example of voltage waveforms of the word line WL, the N-type well 111, and the P-type well 112 at this point. As shown in FIG. 13, with timing that voltage of the word line WL (referred to as a word line WL voltage in FIG. 13) is forced to be a reference voltage Vss, voltage of the P-type well 112 (referred to as a P-well voltage in FIG. 13) increases by approx. 2V from 6V to approx. 8V. After that, voltage of the P-type well 112 is forced to be 0V. It is noted that N-well voltage in FIG. 13 refers to voltage of the N-type well 111.

Such voltage change in the P-type well 112 causes a following problem.

Figure 14:
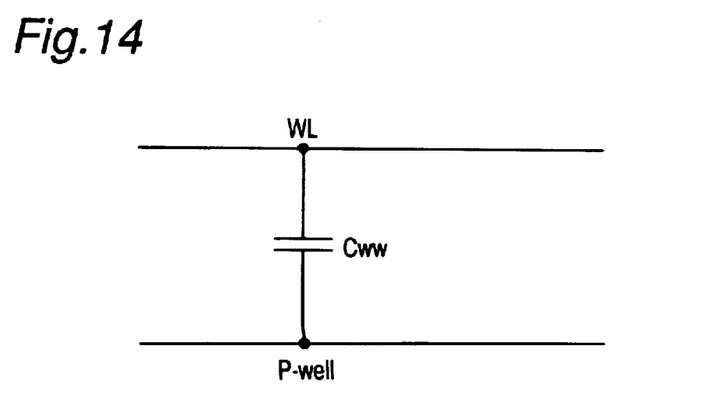
FIG. 14 is an equivalent circuit diagram of a word line WL and a P-type well of the conventional nonvolatile semiconductor memory device.

As shown in FIG. 11, a negative voltage pumping circuit 103 is connected to the word line WL for supplying a negative voltage. In erasing operation, it applies a voltage of −9V to the word line WL. A positive voltage pumping circuit 101 is connected to the P-type well 112 and the N-type well 111 for supplying a positive voltage. The positive voltage pumping circuit 101 is composed of one unit, and in erasing operation it applies a voltage of 6V to the P-type well 112 and the N-type well 111. An equivalent circuit of such word line WL and P-type well 112 is shown in FIG. 14. As shown in FIG. 14, the word line WL and the P-type well 112 are coupled via a memory cell, i.e., a floating-gate field-effect transistor Tr. In the case of a Cww in FIG. 14, one block capacity of, for example, a 0.25 um level flash memory is extremely large as shown below:

$$0.7 fF \times 64 \times 8 \times 1024 = 367 pf$$

It indicates a large coupling ratio. Consequently, when voltage of the word line WL is forced to be a reference voltage Vss from −9V, voltage of the P-type well 112 becomes as further higher, for example, from 6V to 8V. At the same time, voltage of the N-type well 111 also rises up from 6V to around 7V. As a result, the P-type well 112 becomes higher in voltage than the N-type well 111, and therefore forward current is generated between the P-type well 112 whose voltage is approx. 8V and the N-type well 111 whose voltage is approx. 7V, which in the worst case may trigger latchup.

SUMMARY OF THE INVENTION

Accordingly, it is an object of the present invention to provide a highly reliable nonvolatile semiconductor memory device capable of preventing occurrence of latchup.

In order to achieve the above object, there is provided a nonvolatile semiconductor memory device comprising: a memory array composed of a floating-gate field-effect transistor connected to a row line and a column line and disposed in a matrix configuration, the floating-gate field-effect transistor including
a source and a drain formed inside a P-type well provided inside an N-type well on a semiconductor substrate,
a floating gate formed over between the source and the drain with an insulating film interposed therebetween, and
a control gate formed on the floating gate with a insulating film interposed therebetween;
first voltage application means for applying a first voltage to the P-type well when an erasing pulse is applied; and
second voltage application means for applying a second voltage to the N-type well when an erasing pulse is applied.

The above-structured nonvolatile semiconductor memory device has a first voltage application means for applying a first voltage to the P-type well, and a second voltage application means for applying a second voltage to the N-type well, so that voltage can be applied to the P-type well and the N-type well individually. Consequently, setting the second voltage higher than the first voltage prevents current from flowing from the P-type well to the N-type well. Therefore, generation of forward current between the P-type well and the N-type well is prevented. This makes it possible to prevent occurrence of latchup and increase reliability.

In one embodiment of the present invention, the first voltage and the second voltage are positive voltages, and the second voltage is higher than the first voltage.

According to the above nonvolatile semiconductor memory device, the first voltage and the second voltage to be applied to the P-type well and the N-type well are positive voltages. Consequently, applying a negative voltage to a control gate and a positive voltage to a source enables tunnel operation of electrons of a floating gate via the insulating film, and enables discharge of the electrons into the source and the P-type well.

In erasing operation, more particularly, in applying an erasing pulse, the first voltage is applied to the P-type well with use of the first voltage application means, and the second voltage is applied to the N-type well with use of the second voltage application means. As the second voltage is set higher than the first voltage, current is prevented from flowing from the P-type well to the N-type well. Therefore, generation of forward current between the P-type well and the N-type well is prevented. This makes it possible to prevent occurrence of latchup and increase reliability.

In one embodiment of the present invention, the first voltage application means is a first high-voltage pumping circuit for generating the first voltage, and the second voltage application means is a second high-voltage pumping circuit for generating the second voltage.

In one embodiment of the present invention, the first voltage application means is a first high-voltage pumping circuit for generating the first voltage, and the second voltage application means is an auxiliary pumping circuit for generating the second voltage higher than the first voltage by receiving the first voltage.

According to the above nonvolatile semiconductor memory device, the high-voltage pumping circuit and the auxiliary pumping circuit are used, so that a pump layout area can be made extremely small.

In one embodiment of the present invention, the second voltage application means is a high-voltage pumping circuit for generating the second voltage higher than the first voltage, and the first voltage application means is a regulator circuit for generating the first voltage lower than the second voltage by receiving the second voltage.

According to the above nonvolatile semiconductor, the high-voltage pumping circuit and the auxiliary pumping circuit are used, so that a pump layout area can be made extremely small.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The embodiments of the nonvolatile semiconductor memory device of the present invention will be described hereinafter in detail.

(First Embodiment)

Figure 1:
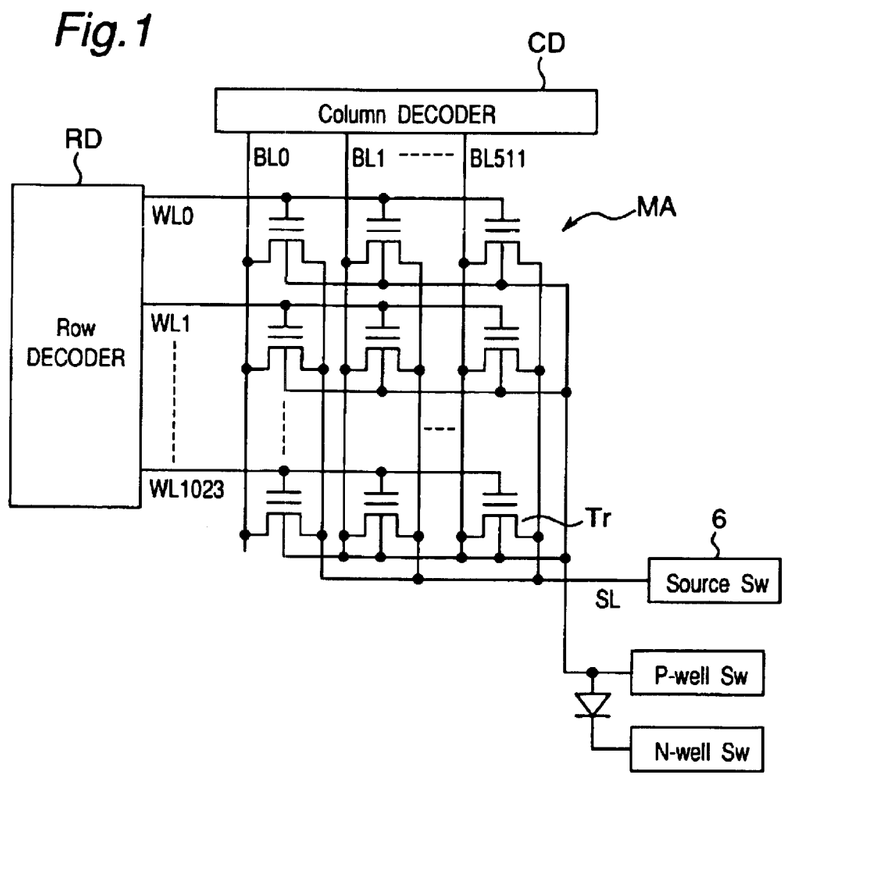
FIG. 1 is a schematic circuit diagram of a nonvolatile semiconductor memory device in a first embodiment of the present invention.

FIG. 1 shows an outlined circuit diagram of a nonvolatile semiconductor memory device in a first embodiment of the present invention.

Figure 3:
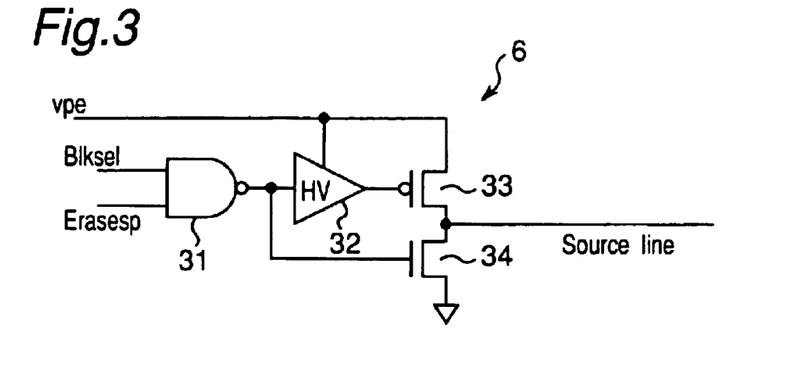
FIG. 3 is a schematic circuit diagram of a source switch of the nonvolatile semiconductor memory device in the first embodiment.

As shown in FIG. 1, the nonvolatile semiconductor memory device consists of a memory array MA composed of floating-gate field-effect transistors Tr disposed in a matrix configuration. The floating-gate field-effect transistors Tr are connected to word lines WL0, WL1, ... WL1023 that are row lines, and to bit lines BL0, BL1, ... BL511 that are column lines. One end of the word lines WL0, WL1, ... WL1023 is connected to a row decoder circuit RD, while one end of the bit lines BL0, BL1, ... BL511 is connected to a column decoder CD. The floating-gate field-effect transistor Tr is connected to a source switch 6 via a source line SL. As shown in FIG. 3, the source switch 6 consists of a NAND gate 31, an amplifier 32, a P-type MOSFET 33, and an N-type MOSFET 34. Between the P-type MOSFET 33 and the N-type MOSFET 34 is connected to a source of the floating-gate field-effect transistor Tr.

Figure 2:
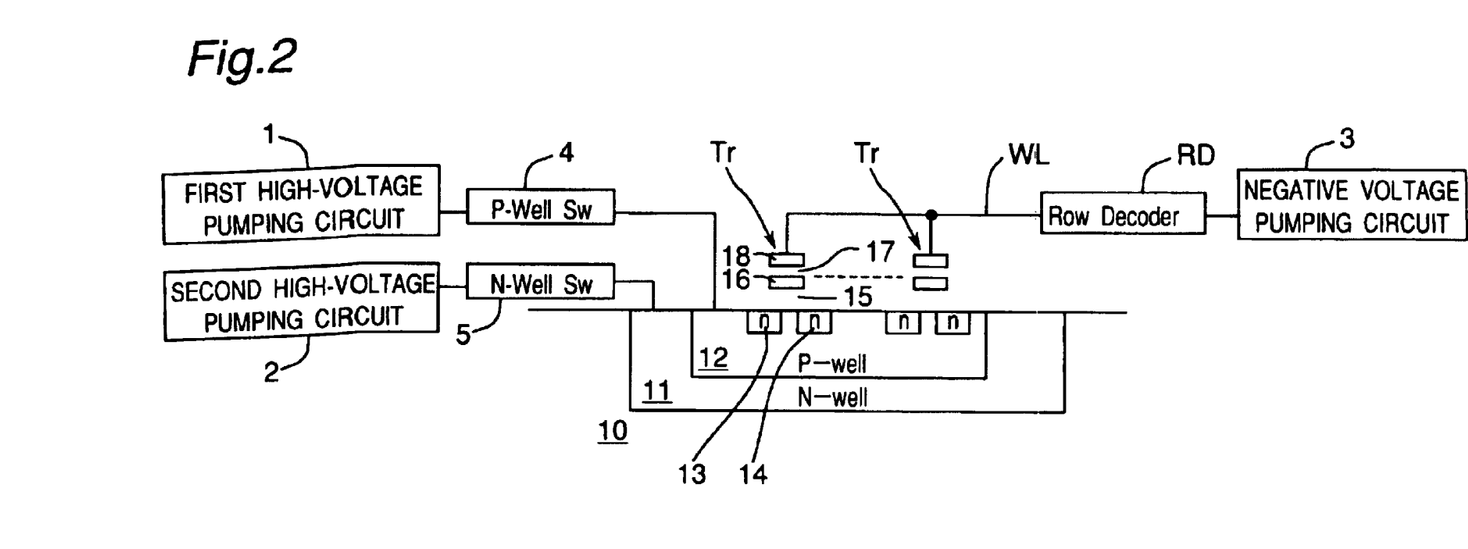
FIG. 2 is an outlined block diagram of the nonvolatile semiconductor memory device in the first embodiment.

As shown in FIG. 2, the floating-gate field-effect transistor Tr is composed of a source 13 and a drain 14 formed inside a P-type well 12 provided inside an N-type well 11 on a P-type semiconductor substrate 10, a floating gate 16 formed over between the source 13 and the drain 14 with a tunnel oxide 15 as an insulating film interposed therebetween, and a control gate 18 formed on the floating gate 16 with an interlayer insulating film 17 as an insulating film interposed therebetween.

Table 3 below shows voltage conditions in writing, erasing, and reading operation of the nonvolatile semiconductor memory device.

TABLE 3

|  | Control gate | Drain | Source | P-type well | N-type well |
| --- | --- | --- | --- | --- | --- |
| Writing | 10 V | 6 V/0 V | 0 V | 0 V | 3 V |
| Erasing | −9 V | OPEN | 6 V (or OPEN) | 6 V | 9 V |
| Reading | 5 V | 1 V | 0 V | 0 V | 3 V |

As shown in Table 3, the conditions of voltage applied in writing and reading operation are same as that of the conventional case shown in Table 2. However, in erasing operation, the drain 14 is set to be in an open state, and a first voltage of, for example, 6V is applied to the source 13 and the P-type well 12. Though not shown in the drawing, the source voltage may be in an open state. At this point, a voltage of −9V is applied to the control gate 18, while a second voltage of, for example, 9V is applied to the N-type well 11. As a result, electrons are pulled out from the floating gate 16, and the threshold value is decreased.

One example of the erasing circuit for implementing such voltage conditions in erasing operation is provided with, as shown in FIG. 2, a negative pumping circuit 3 for applying a negative voltage of −9V to the word line WL via the row decoder RD. In addition, there are provided a first high-voltage pumping circuit 1, that is a first voltage application means for applying a voltage of 6V to the P-type well 12, and a second high-voltage pumping circuit 2, that is a second voltage application means for applying a voltage of 9V to the N-type well 11. The first high-voltage pumping circuit 1 is connected to the P-type well 12 via a P-type well switch 4, whereas the second high-voltage pumping circuit 2 is connected to the N-type well 11 via an N-type well switch 5.

Figure 4:
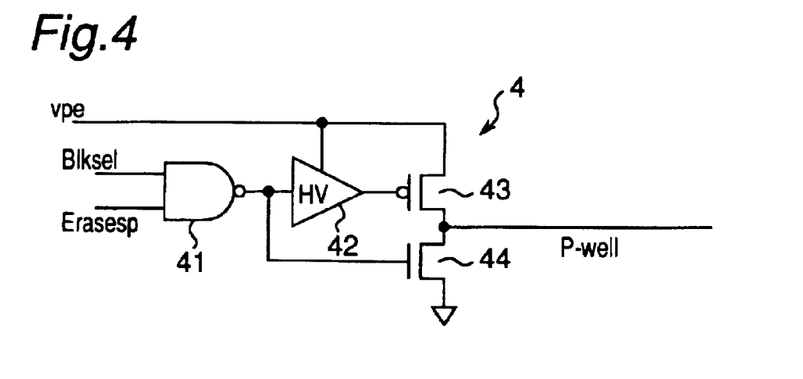
FIG. 4 is a schematic circuit diagram of a P-type well of the nonvolatile semiconductor memory device in the first embodiment.

The first high-voltage pumping circuit 1 outputs a voltage of 6V, and applies the voltage of 6V to the P-type well 12 via the P-type well switch 4. The P-type well switch 4 is, as shown in FIG. 4, composed of a NAND gate 41, an amplifier 42, a P-type MOSFET 43, and an N-type MOSFET 44. Between the P-type MOSFET 43 and the N-type MOSFET 44 is connected to the P-type well 12. When a block to be erased is selected, a Blksel is set to high, and an erase command is inputted, and then an Erasesp signal that is an erasing pulse application signal is set to high. As a result, a Vpe voltage, that is a voltage of 6V, is outputted to the P-type well 12 of that block.

Figure 5:
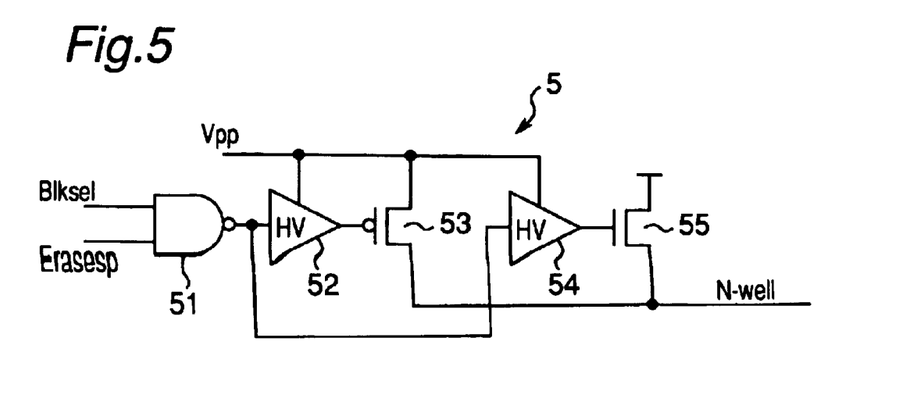
FIG. 5 is a schematic circuit diagram of a N-type well of the nonvolatile semiconductor memory device in the first embodiment.

The second high-voltage pumping circuit 2 outputs a voltage of 9V, and applies the voltage of 9V to the N-type well 11 via the N-type well switch 5. The N-type well switch 5 is, as shown in FIG. 5, composed of a NAND gate 51, amplifiers 52 and 54, a P-type MOSFET 53, and an N-type MOSFET 55. When a block to be erased is selected, a Blksel is set to high, and an Erasesp signal that is an erasing pulse application signal is set to high. As a result, a Vpp voltage (9V) is outputted to the N-type well 11 of that block.

When pulse application is completed, there is executed a shutdown sequence for setting voltage of the P-type well 12 and the word line WL to be a reference voltage Vss (0V). As a consequence, an Erasesp signal of the P-type well switch 4 is set to low, the word line WL is forced to have the reference voltage Vss, and the P-type well 12 is forced to have the reference voltage Vss.

Figure 6:
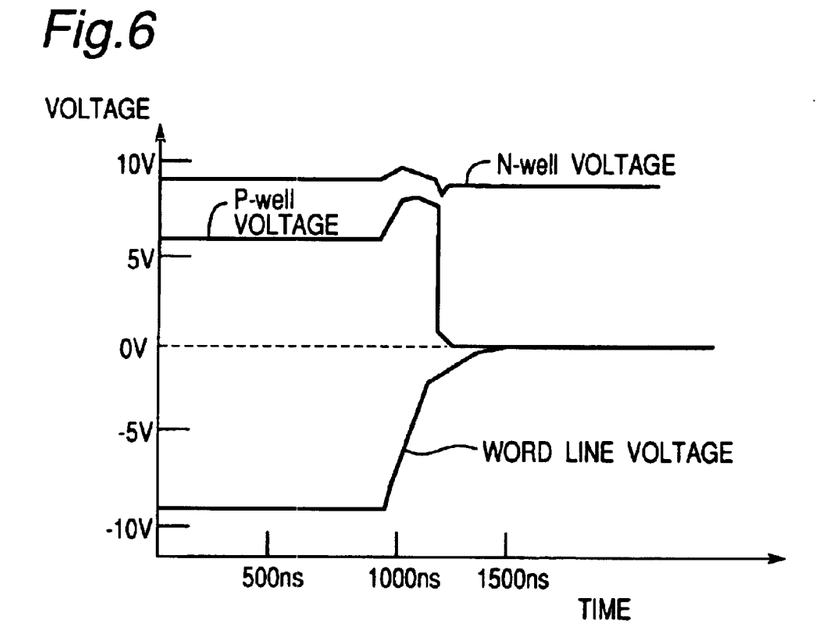
FIG. 6 is a graph showing voltage waveforms of a word line, an N-type well and a P-type well of the nonvolatile semiconductor memory device in the first embodiment.

Finally, the first high-voltage pumping circuit 1, the second high-voltage pumping circuit 2, and the negative pumping circuit 3 are stopped. FIG. 6 shows one example of voltage waveforms of the word line WL, P-type well 12, and the N-type well 11 at this point. As shown in FIG. 6, with timing that voltage of the word line WL (referred to as a word line voltage in FIG. 6) is forced to be a reference voltage Vss from −9V, voltage of the P-type well 12 (referred to as a P-well voltage in FIG. 6) increases by approx. 2V from 6V to approx. 8V. After that, voltage of the P-type well 12 is forced to be a reference voltage Vss. At this point, because the P-type well 12 and the N-type well 11 are coupled, shift of the voltage of the P-type well 12 from 6V to 8V causes voltage of the N-type well 11 (referred to as an N-well voltage in FIG. 6) to shift from 9V to 10V.

As shown above, voltage of the N-type well 11 is always higher than voltage of the P-type well 12, so that forward current does not flow between the P-type well 12 and the N-type well 11. This makes it possible to prevent generation of a trigger of latchup and increase reliability.

In the first embodiment, in erasing operation there were outputted a voltage of −9V to the control gate 18, a voltage of 6V to the source, a voltage of 6V to the P-type well 12, and a voltage of 9V to the N-type well 11. However, voltage to be outputted to the control gate 18, the source 13, the P-type well 12, and the N-type well 11 is not limited thereto. Proper voltage to be outputted to the P-type well 12 and the N-type well 11 is a positive voltage, and proper voltage to be applied to the N-type well 11 is a voltage higher than the voltage to be applied to the P-type well 12.

(Second Embodiment)

Figure 7:
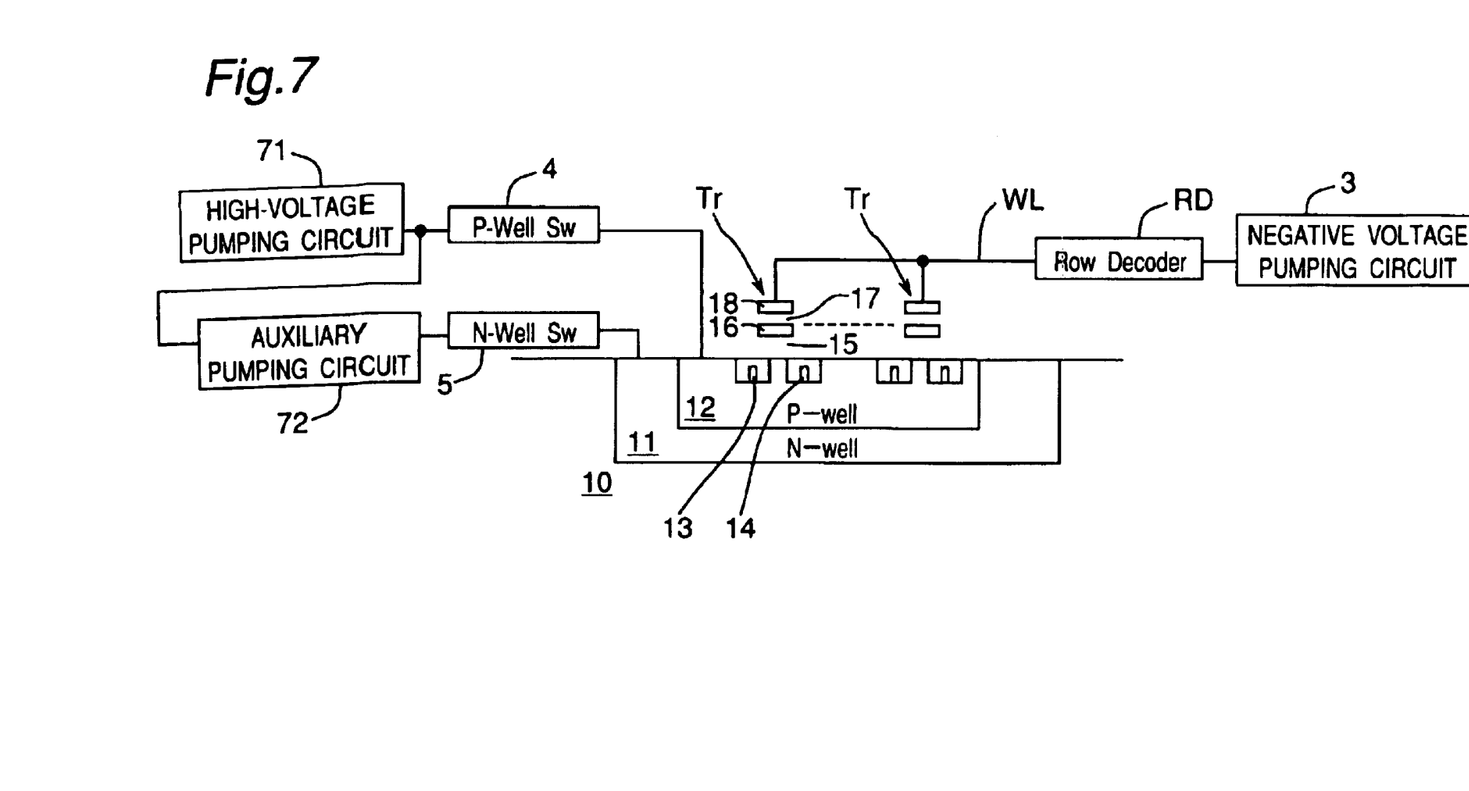
FIG. 7 is a schematic circuit diagram of a nonvolatile semiconductor memory device in a second embodiment of the present invention.

FIG. 7 is an outlined block diagram of a nonvolatile semiconductor memory device in a second embodiment of the present invention. It is noted that in the present embodiment, component members same as those in FIG. 2 are designated by the same reference numerals, and description thereof is omitted.

In the nonvolatile semiconductor memory device, application voltage conditions in writing, erasing and reading operation are identical to those described in the first embodiment. What is different from the first embodiment is the structure of an erasing circuit.

The following description discusses the erasing circuit of the nonvolatile semiconductor memory device.

As shown in FIG. 7, the erasing circuit has a negative pumping circuit 3 for applying a negative voltage of −9V to a word line WL via a row decoder RD. On the well side, there are provided a high-voltage pumping circuit 71 that is a first voltage application means for applying a first voltage of 6V to the P-type well 12, as well as an auxiliary pumping circuit 72 that is a second voltage application means for applying a second voltage of 9V to the N-type well 11. The high-voltage pumping circuit 71 is connected to the P-type well 12 via a P-type well switch 4. Between the high-voltage pumping circuit 71 and the P-type well switch 4 is connected to the N-type well 11 via the auxiliary pumping circuit 72 and an N-type well switch 5. Upon reception of an output voltage from the high-voltage pumping circuit 71, the auxiliary pumping circuit 72 amplifies the output voltage, and outputs it to the N-type well 11.

The high-voltage pumping circuit 71 outputs a voltage of 6V, and outputs the voltage of 6V to the P-type well 12 via the P-type well switch 4. When a block to be erased is selected, in the P-type well switch 4 as shown in FIG. 4, a Blksel is set to high and an erase command is inputted, and then an Erasesp signal that is an erasing pulse application signal is set to high. As a result, a Vpe voltage, that is a voltage of 6V, is outputted to the P-type well 12 of that block.

With use of the output voltage of 6V from the high-voltage pumping circuit 71 as an input voltage, the auxiliary pumping circuit 72 amplifies the input voltage of 6V, and outputs a voltage of 9V. Consequently, via the N-type well switch 5, the voltage of 9V is applied to the N-type well 11. When a block to be erased is selected, in the N-type well switch 5 as shown in FIG. 5, a Blksel is set to high and an Erasesp signal that is an erasing pulse application signal is set to high. As a result, a Vpp voltage, that is a voltage of 9V, is outputted to the N-type well 11 of that block.

When pulse application is completed, there is executed a shutdown sequence for setting voltage of the P-type well 12 and the word line WL to be a reference voltage Vss (0V). As a consequence, an Erasesp signal of the P-type well switch 4 is set to low, the word line WL is forced to have the reference voltage Vss, and the P-type well 12 is forced to have the reference voltage Vss.

Finally, the high-voltage pumping circuit 71, the auxiliary pumping circuit 72, and the negative pumping circuit 3 are stopped. As shown in FIG. 6, with timing that voltage of the word line WL is forced to be a reference voltage Vss from −9V, voltage of the P-type well 12 increases by approx. 2V from 6V to approx. 8V. After that, voltage of the P-type well 12 is forced to be a reference voltage Vss. At this point, because the P-type well 12 and the N-type well 11 are coupled, shift of the voltage of the P-type well 12 from 6V to 8V causes voltage of the N-type well 11 to shift from 9V to 10V.

As shown above, voltage of the N-type well 11 is always higher than voltage of the P-type well 12, so that forward current does not flow between the P-type well 12 and the N-type well 11. This makes it possible to prevent generation of a trigger of latchup and increase reliability.

The high-voltage pumping circuit 71 and the auxiliary pumping circuit 72 are used, so that a pump layout area can be made extremely small.

In the second embodiment, in erasing operation there were outputted a voltage of −9V to the control gate 18, a voltage of 6V to the source, a voltage of 6V to the P-type well 12, and a voltage of 9V to the N-type well 11. However, voltage to be outputted to the control gate 18, the source 13, the P-type well 12, and the N-type well 11 is not limited thereto. Proper voltage to be outputted to the P-type well 12 and the N-type well 11 is a positive voltage, and proper voltage to be applied to the N-type well 11 is a voltage higher than the voltage to be applied to the P-type well 12.

(Third Embodiment)

Figure 8:
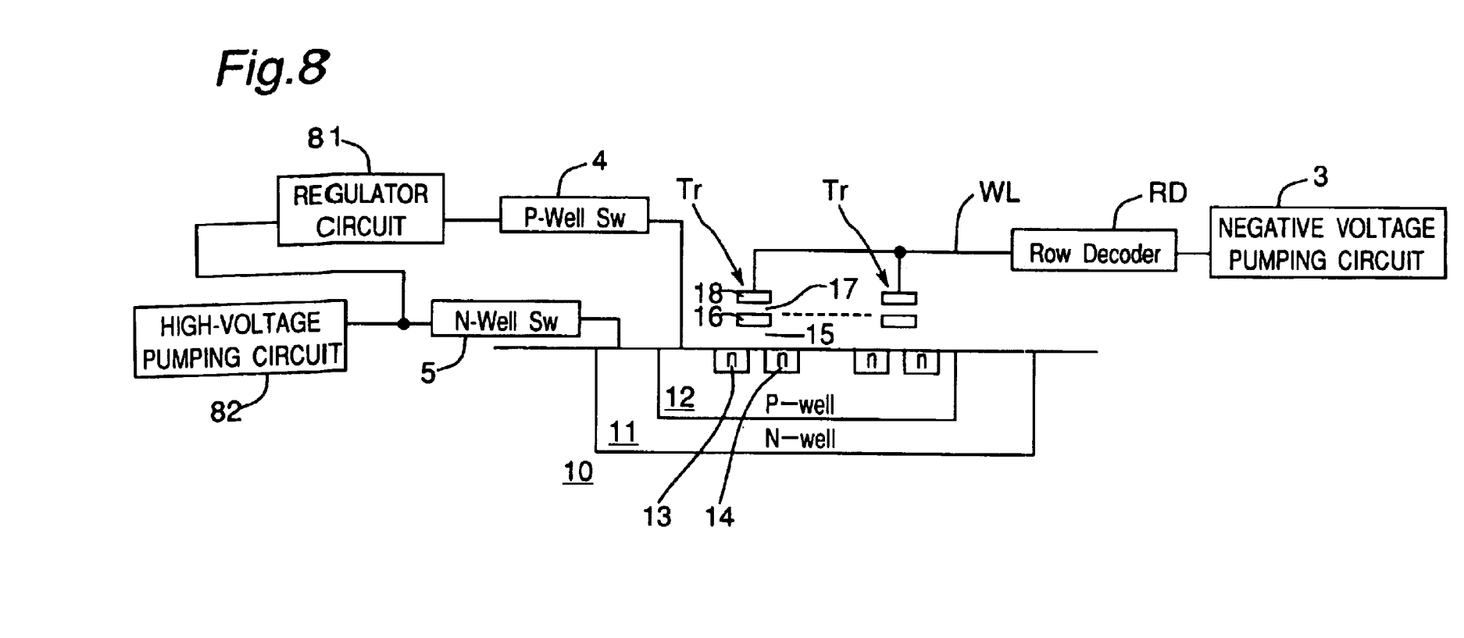
FIG. 8 is an outlined block diagram of the nonvolatile semiconductor memory device in the third embodiment.

FIG. 8 is an outlined block diagram of a nonvolatile semiconductor memory device in a third embodiment of the present invention. It is noted that in the present embodiment, component members same as those in FIG. 2 are designated by the same reference numerals, and description thereof is omitted.

In the nonvolatile semiconductor memory device, application voltage conditions in writing, erasing and reading operation are identical to those described in the first embodiment. What is different from the first embodiment is the structure of an erasing circuit.

The following description discusses the erasing circuit of the nonvolatile semiconductor memory device.

As shown in FIG. 8, the erasing circuit has a negative pumping circuit 3 for applying a negative voltage of −9V to a word line WL via a row decoder RD. On the well side, there are provided a regulator circuit 81, that is a first voltage application means for applying a first voltage of 6V to the P-type well 12, as well as a high-voltage pumping circuit 82, that is a second voltage application means for applying a second voltage of 9V to the N-type well 11. The high-voltage pumping circuit 82 is connected to the N-type well 11 via a N-type well switch 5. Between the high-voltage pumping circuit 82 and the N-type well switch 5 is connected to the P-type well 12 via the regulator circuit 81 and the P-type well switch 4. Upon reception of an output voltage from the high-voltage pumping circuit 82, the regulator circuit 81 outputs a voltage lower than the output voltage to the P-type well 12. The output voltage from the regulator circuit 81 is controlled to be constant.

The high-voltage pumping circuit 82 outputs a voltage of 9V, and applies the voltage of 9V to the N-type well 11 via the N-type well switch 5. When a block to be erased is selected, in the N-type well switch 5 as shown in FIG. 5, a Blksel is set to high and an erase command is inputted, and then an Erasesp signal that is an erasing pulse application signal is set to high. As a result, a Vpp voltage, that is a voltage of 9V, is outputted to the N-type well 11 of that block.

The regulator circuit 81 receives the output voltage of 9V from the high-voltage pumping circuit 82, and outputs a voltage of 6V obtained by regulating the output voltage of 9V to the P-type well 12 via the P-type well switch 4. When a block to be erased is selected, in the P-type well switch 4 as shown in FIG. 4, a Blksel is set to high and an Erasesp signal that is an erasing pulse application signal is set to high. As a result, a Vpe voltage, that is a voltage of 6V, is outputted to the P-type well 12 of that block.

When pulse application is completed, there is executed a shutdown sequence for setting voltage of the P-type well 12 and the word line WL to be a reference voltage Vss (0V). As a consequence, an Erasesp signal of the P-type well switch 4 is set to low, the word line WL is forced to have the reference voltage Vss, and the P-type well 12 is forced to have the reference voltage Vss.

Finally, the high-voltage pumping circuit 82, and the negative voltage pumping circuit 3 are stopped. FIG. 6 shows one example of voltage waveforms of the word line WL, P-type well 12, and the N-type well 11 at this point. As shown in FIG. 6, with timing that voltage of the word line WL is forced to be a reference voltage Vss from −9V, voltage of the P-type well 12 increases by approx. 2V from 6V to approx. 8V. After that, voltage of the P-type well 112 is forced to be a reference voltage Vss. At this point, because the P-type well 12 and the N-type well 11 are coupled, shift of the voltage of the P-type well 12 from 6V to 8V causes voltage of the N-type well 11 to shift from 9V to 10V.

As shown above, voltage of the N-type well 11 is always higher than voltage of the P-type well 12, so that forward current does not flow between the P-type well 12 and the N-type well 11. This makes it possible to prevent generation of a trigger of latchup and increase reliability.

In the third embodiment, in erasing operation there were outputted a voltage of −9V to the control gate 18, a voltage of 6V to the source, a voltage of 6V to the P-type well 12, and a voltage of 9V to the N-type well 11. However, voltage to be outputted to the control gate 18, the source 13, the P-type well 12, and the N-type well 11 is not limited thereto. Proper voltage to be outputted to the P-type well 12 and the N-type well 11 is a positive voltage, and proper voltage to be applied to the N-type well 11 is a voltage higher than the voltage to be applied to the P-type well 12.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A nonvolatile semiconductor memory device comprising:

a memory array comprising a plurality of floating-gate field-effect transistors disposed in a matrix configuration, the transistors being connected to corresponding row lines and column lines, at least one of the transistors comprising
a source and a drain which are formed inside a P-type well formed inside an N-type well formed on a semiconductor substrate,
a floating gate formed above a portion of the semiconductor substrate between the source and the drain with an insulating film interposed between the floating gate and said portion of the semiconductor substrate, and
a control gate formed on the floating gate with another insulating film interposed therebetween;

a first voltage application circuit applying a first voltage to the P-type well when an erasing pulse is applied; and a second voltage application circuit applying a second voltage to the N-type well when the erasing pulse is applied.

2. The nonvolatile semiconductor memory device of claim 1, wherein the first voltage and the second voltage are positive voltages, and the second voltage is higher than the first voltage.

3. The nonvolatile semiconductor memory device of claim 1, wherein the first voltage application circuit comprises a first high-voltage pumping circuit for generating the first voltage, and the second voltage application circuit comprises a second high-voltage pumping circuit for generating the second voltage.

4. The nonvolatile semiconductor memory device of claim 1, wherein the first voltage application circuit comprises a high-voltage pumping circuit for generating the first voltage, and the second voltage application circuit comprises an auxiliary pumping circuit for raising the first voltage to generate the second voltage.

5. The nonvolatile semiconductor memory device of claim 1, wherein the second voltage application circuit comprises a high-voltage pumping circuit for generating the second voltage, and the first voltage application circuit comprises a regulator circuit for lowering the second voltage to generate the first voltage.

* * * * *